United States Patent [19]

Schwager et al.

[11] Patent Number: 4,464,620

[45] Date of Patent: Aug. 7, 1984

[54] CIRCUIT FOR GENERATING A SINUSOIDAL SYNCHRONIZATION VOLTAGE FOR FIRING THYRISTORS

[75] Inventors: Anton Schwager, Effretikon; Hans-Jörg Suter, Winkel, both of Switzerland

[73] Assignee: Contraves AG, Zurich, Switzerland

[21] Appl. No.: 365,649

[22] Filed: Apr. 5, 1982

[30] Foreign Application Priority Data

Apr. 22, 1981 [CH] Switzerland ............ 2623/81

[51] Int. Cl.³ .............................................. G05F 5/00
[52] U.S. Cl. ............................ 323/300; 307/252 N; 318/345 G
[58] Field of Search ............ 307/252 R, 252 N; 318/345 G; 323/300; 363/128, 129

[56] References Cited

U.S. PATENT DOCUMENTS

| | | | |
|---|---|---|---|
| 3,942,041 | 3/1976 | Morriss | 307/252 N X |
| 3,958,172 | 5/1976 | Beck | 323/300 |
| 4,028,609 | 6/1977 | Detering | 363/129 |
| 4,042,873 | 8/1977 | Cox | 363/128 X |
| 4,117,392 | 9/1978 | Kintigh et al. | 307/252 N X |
| 4,346,339 | 8/1982 | Lewandowski | 323/300 X |
| 4,394,723 | 7/1983 | Hoffman | 318/345 G X |

Primary Examiner—William M. Shoop
Attorney, Agent, or Firm—Werner W. Kleeman

[57] ABSTRACT

A synchronization voltage is formed as the product of the output voltage of a phase-locked loop and the mean value of the magnitude of the network voltage. The synchronization voltage is compared with the network voltage. A first control signal is formed when both voltages are the same. A reversing switch, in a first switching state, conducts the network voltage and, in a second switching state, conducts the synchronization voltage to a reference frequency-input of the phase-locked loop. A second control signal is formed when the phase-locked loop locks or latches with the thereto inputted reference frequency. The reversing switch is controlled by both control signals such that upon absence of the first control signal and the simultaneous presence of the second control signal there is attained the second switching state and otherwise the first switching state. The circuit can be beneficially used in a current regulation circuit of a drive for a powerful electric motor, with a power supply network operating at up to 400 Hz with a weak generator.

1 Claim, 3 Drawing Figures

CIRCUIT FOR GENERATING A SINUSOIDAL SYNCHRONIZATION VOLTAGE FOR FIRING THYRISTORS

BACKGROUND OF THE INVENTION

The present invention relates to a new and improved construction of a circuit arrangement for generating a sinusoidal synchronisation voltage for the firing of thyristors in a current regulation circuit of a drive for an electric motor.

It is known for thyristor drives to derive the synchronisation voltage for the firing of the thyristors from the same power supply network from which there is removed the drive current. However, this is not possible when working with high-output drives which are employed, for instance, for different types of military equipment and which are powered by small 400 Hz generators of the type used in the aircraft industry, at least for the following reasons:

In the observed equipment the network frequency markedly varies, especially if the generator is provided with a flywheel or driven plate acting as an energy storage. The delivery of the drive output and the take-up of the brake load by the generator can cause fluctuations of the network frequency between about 350 Hz and 450 Hz.

Because in the considered equipment the peak load essentially consists of thyristor bridge circuits loaded by the electric motor and the considered power supply network containing the aforementioned small generator and the infeed lines possess a greater inductance than conventional networks, such as for instance the power supply network of a city or municipality which powers conventional drives, there arises during cut-on and during load change a much more pronounced fluctuation of the network voltage in the supply network of the considered equipment than in conventional networks. In the description to follow there is to be understood under the term "fluctuations" a disturbance of the network voltage which essentially affects the amplitude.

Upon commutation breakdown of the voltage at the thyristors the product of shift and time duration for a voltage breakdown, among other things, is proportional to the frequency and the inductance of the supply network as well as to the load current. Thus, the product of the shift and time duration for the considered supply network of about 400 Hz is appreciably greater than with a network working at 50 Hz and, additionally, is markedly dependent upon load and current, respectively. The fundamental wave or waveform of the undistorted network voltage, because of the commutation breakdown, is superimposed upon a non-sinusoidal waveform, whose fundamental wave is phase shifted in relation to the undistorted network voltage as a function of the current, in other words the firing angle. The resultant fundamental waveform of the network voltage is shifted in relation to the fundamental waveform of the undisturbed network voltage by a variable phase angle, which can amount up to ±20°. Under these circumstances the known simple filter circuits for the extraction of a sinusoidal synchronisation voltage from the resultant distorted network voltage are incapable of working satisfactorily. In the description to follow there is to be understood under the expression "distortion" a disturbance of the network voltage which essentially affects the sinusoidal shape and/or the phase.

SUMMARY OF THE INVENTION

Therefore, with the foregoing in mind it is a primary object of the present invention to provide a new and improved construction of circuit for generating a sinusoidal synchronisation voltage for the firing of thyristors in a manner not associated with the aforementioned drawbacks and limitations of the prior art.

Another and more specific object of the present invention aims at generating a synchronisation voltage of the aforementioned type which remains phase and amplitude locked with respect to the undistorted, however possibly fluctuating network voltage if, among other things, the firing angle, the load current, the network frequency, the network voltage and/or the shape of the network waveform varies.

In U.S. Pat. No. 4,042,873, granted Aug. 16, 1977, there is proposed a circuit of the aforementioned type which contains a phase regulation circuit (phase-locked loop (PLL)), the output voltage of which is rigidly locked in frequency and phase with the network voltage and serves as the synchronisation voltage. In order to ensure the proper point in time for the firing pulses for the thyristors, notwithstanding possible fluctuations in the network voltage, the aforementioned U.S. Pat. No. 4,042,873 proposes generating from the output voltage of the PLL a sawtooth function and producing therefrom the firing pulses, so that there is compensated the influence of frequency fluctuations. However, this circuit is not capable of compensating the influence of the commutation breakdown. As previously explained and as will be further discussed in conjunction with FIG. 2 of this disclosure, such commutation breakdown causes a variable and, under circumstances, large phase shift of the resultant network voltage. This shifts the phase of the firing pulses in relation to the undistorted network voltage in an undesired manner, since the PLL locks to the resultant distorted network voltage.

In International Journal of Electronics, 1979, Volume 47, Number 2, pages 139–145 there is proposed a further circuit of the previously mentioned type. This circuit likewise contains a PLL, the output voltage of which is locked in frequency and phase with the network voltage and is employed for generating the firing pulses, in this case with the aid of digital circuit technology. Also, with this circuit there is overcome the affects of fluctuations and frequency changes of the network voltage, not however the affects of the commutation breakdown, because also in this case the resultant distorted network voltage serves as the reference voltage for the latching or locking of the PLL.

In the presence of commutation breakdowns in the network voltage such alters a number of times within a cycle in a sudden fashion, which, in turn, causes the previously discussed phase shift. It is known, for instance from U.S. Pat. No. 3,903,482, granted Sept. 2, 1975, to stabilise a PLL with regard to changes in its reference voltage or potential, in this case the network voltage. For this purpose there is maintained constant the voltage inputted to its follow-up oscillator (voltage-controlled oscillator (VCO)) by means of switches and memories when the control voltage of the VCO generated in the PLL rapidly alters and as long as it deviates from the voltage which is maintained constant at the VCO. This circuit is intended to eliminate in telecommunication systems the effect of phase changes of a received wave, for instance caused by interferences. Typically, there must be bridged 10 to 600 seconds of continuous phase shifts of the received wave. The circuit according to the aforementioned U.S. Pat. No. 3,903,482 cannot, however, be effectively employed when it is significant to eliminate the effects of commutation breakdowns in a network voltage. The PLL locks with the resultant distorted network voltage because the control voltage of the VCO, generated by the PLL, appears at the output of a low-pass filter, and thus, cannot follow the appearance and disappearance of the commutation breakdowns.

Other circuits using a combination of PLL, switches and memories have been disclosed, for instance, in U.S. Pat. Nos. 3,573,649, 4,063,188 and 4,101,844, respectively, granted Apr. 6, 1971, Dec. 13, 1977 and July 18, 1978. It is their intent to maintain the operation of the PLL at the same frequency after disappearance of the inputted reference voltage, in other words to provide a storage for the frequency of a short-time received wave. For this purpose the switches and memories or storages are actuated at a predetermined time after the locking of the PLL, in order to maintain constant the voltage inputted to its VCO. Also with such circuits there is not eliminated the effects of commutation breakdowns of the network voltage, because also in this case the PLL locks or latches to the resultant distorted network voltage.

The invention is predicated upon the recognition that for use as a synchronisation voltage there is to be produced a sinusoidal voltage which simulates the undistorted network voltage during the commutation breakdowns while taking into account the voltage fluctuations which arise upon cut-on or even during load change because of the time-constant of the regulator.

In its more specific aspects, there is provided according to the invention a circuit for generating a sinusoidal synchronisation voltage for the firing of thyristors in a current regulation circuit of a drive for an electric motor which is powered by a power supply network. Such circuit is manifested by the features that the synchronisation voltage is formed as the product of the output voltage of a PLL and the mean value of the magnitude of the network voltage of the power supply network in such a manner that the output voltage of the PLL equals the synchronisation voltage when the network voltage is sinusoidal and its peak value possesses a predetermined reference value. The synchronisation voltage is compared with the network voltage and there is produced a first control signal when the network voltage essentially is equal to the synchronisation voltage. A reversing switch, in a first switching state, conducts the network voltage to a reference frequency-input of the PLL and, in a second switching state, conducts the synchronisation voltage to the reference frequency-input of the PLL. The phase of the voltage applied to the reference frequency-input of the PLL is compared with the phase of the output voltage of the PLL, and there is generated a second control signal when the corresponding phase difference essentially is equal to null. The reversing switch is controlled by both control signals in a manner such that the reversing switch, upon absence of the first control signal and simultaneous presence of the second control signal, assumes the second switching state, otherwise assumes the first switching state.

With the circuit proposed by the invention there is achieved the result that the PLL is synchronised by the network voltage, as long as such remains essentially undistorted, so that the synchronisation voltage remains phase locked with the network voltage also in the presence of frequency changes. However, if there arises a distortion of the network voltage then the PLL is feedback coupled to itself, so that it retains the phase of the undistorted network voltage until the distortion of the network voltage discontinues, something which can last up to 200 microseconds because of the commutation breakdown. Consequently, there is maintained constant the ratio of the amplitude of the synchronisation voltage to the amplitude of the resultant fundamental wave of the possibly fluctuating network voltage. The firing angle of the thyristor thus remains unaffected by distortions in the network voltage as well as upon changes in its amplitude and frequency. Furthermore, there is ensured that from the time of cutting-on the power supply until locking of the output voltage of the PLL with the phase of the undistorted network voltage the latter will be applied to the reference frequency-input of the PLL, so that locking or latching can even occur.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE PREFERRED EMBODIMENTS

Figure 1:
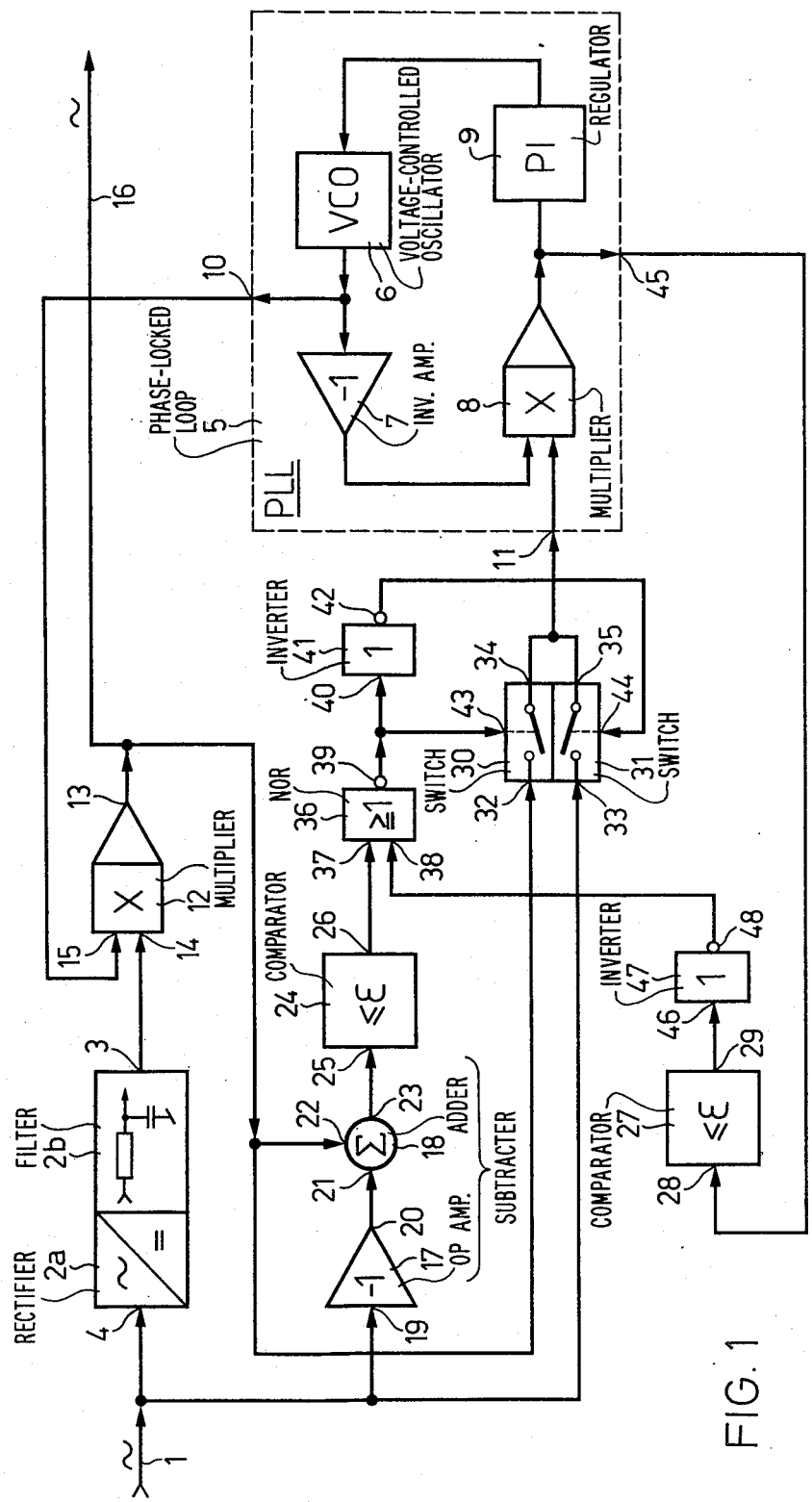
FIG. 1 is a block circuit diagram of a circuit constructed according to the invention.

Describing now the drawings, in FIG. 1 there is shown by way of example, and not limitation, a block circuit diagram of a circuit for generating a sinusoidal synchronisation voltage for the firing of thyristors in a current regulation circuit of a drive powered by a power supply network and serving for driving an electric motor for instance. The illustrated block circuit configuration has been used in lieu of a detailed circuit diagram of the circuit components because they as such are known in the electronics art, for instance as described in the textbook of U. Tietze and Ch. Schenk, entitled "Halbleiter-Schaltungstechnik", Fourth Edition, Springer-Verlag, 1978. In the description to follow reference will be made to this textbook under the abbreviated symbol "TS", and there will be indicated in each instance the location in such textbook where there has been described in detail the corresponding circuit component.

The circuitry of FIG. 1 is connected with a phase line or conductor 1 of the power supply network. The network voltage $U_P$ which appears in the phase line or conductor 1 is defined with reference to a not particularly depicted ground conductor or line. In the case of a three-phase power supply network a respective circuit is connected with each respective one of the three phase lines.

The circuit component or section designated by reference characters 2a and 2b comprises a full-wave rectifier 2a containing a low-pass filter 2b of the first order, for instance of the type described in "TS" at pages 656–657 and portrayed in FIG. 25.11. At the output 3 of this circuit component or section there appears the magnitude mean value $U_M = |\overline{U_P}|$ the network voltage $U_P$ which was applied to its input 4 and infed by the phase line or conductor 1. Reference character $U_M$ represents a purely direct-current voltage, and any possibly remaining wavyness or undulations can be reduced to a negligible value, in conventional manner, by using a low-pass filter of the second order instead of a low-pass filter of the first order.

The circuit component or section designated by reference character 5 is a phase regulation circuit, a phase-locked loop (PLL), for instance of the type described in "TS" at pages 683–691 and depicted in FIGS. 26.20, 26.24 and 26.26, equipped with a follow-up oscillator 6, a so-called voltage-controlled oscillator (VCO), an inverting amplifier 7 having a gain of, for instance, −1, a multiplier 8 and a regulator 9 possessing proportional and integral action. At the output or output side 10 of the PLL 5 there appears the sinusoidal voltage generated by the VCO 6, which is then locked in synchronism in frequency and phase with the voltage applied to the reference frequency-input 11 of the PLL 5.

The circuit component or section designated by reference character 12 is a four-quadrant multiplier, for instance of the type described in "TS" at pages 226–230 and depicted in FIG. 14.41. Also the multiplier 8 can be a multiplier of this type. At the output 13 of the multiplier 12 there appears a voltage constituting the product of the voltages inputted to its inputs 14 and 15, namely the magnitude mean value $U_M$ inputted from the output 3 and the sinusoidal voltage inputted from the output 10. The gain which is inherent for the multiplier 12 is selected or set such that the voltages appearing at the input 15 and at the output 13 are equal to one another when the voltage $U_M$ possesses its reference value, something which is the case when the network voltage $U_P$ appearing at the phase line or conductor 1 is of purely sinusoidal shape and its peak value possesses a predetermined reference value, for instance at 115 volts alternating-current voltage. The voltage at the output 13 is essentially sinusoidal, and it is used as the synchronisation voltage for the firing of the thyristors and, for such purpose, is delivered to a line or conductor 16.

The circuit component or section designated by reference characters 17 and 18 is a subtracter, for instance of the type described in "TS" at pages 190–191 and depicted in FIG. 11.2. An operational amplifier 17 having a gain of −1 allows the voltage applied to its input 19 to appear with the same absolute value and inverse sign at its output 20. The input 19 is connected with the phase line or conductor 1. An adder 18 forms the sum of the voltages applied at its inputs 21 and 22, the result of the addition appearing at its output 23. The input 21 is connected with the output 20 and the input 22 with the output 13. Consequently, there appears at the output 23 the difference between the network voltage and the synchronisation voltage with a sign which here is of no importance.

The circuit component or section designated by reference character 24 is a window comparator, for instance of the type described in "TS" page 413 and depicted in FIG. 17.24. Its input 25 has infed thereto the voltage difference appearing at the output 23. At the output 26 there appears a logic signal "1" when the voltage at its input 25 lies between both of the boundary values plus $+\epsilon$ and $-\epsilon$, wherein $\epsilon$ is a predetermined extremely small voltage in comparison to the reference peak value of $U_P$. This logic signal "1" is designated as the first control signal. Consequently, the first control signal appears when the synchronisation voltage and the network voltage are essentially identical, meaning outside of the times where there occurs a commutation breakdown.

The circuit component or section designated by reference character 27 is constituted by a window comparator of the same type. Its input 28 has inputted thereto, by means of an output 45 of the PLL 5, the voltage appearing in the PLL 5 at the output side of the multiplier 8. This voltage, as is well known in the electronics art, is proportional to the follow-up or servo error of the PLL 5. Consequently, a logic signal "1" appears at the output 29 of the window comparator 27 when the voltages appearing at the input 11 and at the output 10 of the PLL 5 are essentially equal in frequency and phase. Then, the PLL 5 is locked, which also means that the voltage inputted to the input 11 has its frequency and phase in synchronism with that of the synchronisation voltage. The corresponding logic signal "1" is designated as the second control signal.

The output 29 of the window comparator 27 is connected with the input 46 of an inverter or a NOT-gate or circuit 47, so that there appears at the output 48 of the inverter 47 the logical complement of the second control signal.

The switches designated by reference characters 30 and 31 are electronic series switches, for instance CMOS-series switches of the type described in "TS" at pages 398–399 and depicted in FIG. 17.4. Each of the switches 30 and 31 becomes conductive when its control input receives a logic signal "1". The input 32 of the switch 30 is connected with the output 13, and therefore it receives the synchronisation voltage. The input 33 of the switch 31 is connected with the phase line or conductor 1, and thus receives the network voltage. The output 34 of the switch 30 and the output 35 of the switch 31 are coupled with one another, so that both switches 30 and 31 collectively form a reversing switch or reversing switch means, whose common output 34, 35 is connected with the reference frequency-input 11 of the PLL 5. As will be explained more fully hereinafter in this disclosure, the switches 30 and 31 are controlled out-of-phase, so that during a first switching state the switch 30 blocks or is non-conductive and the switch 31 is conductive, whereas in a second switching state the switch 30 is conductive and the switch 31 blocks. Consequently, in the first switching state there is inputted the network voltage to the reference frequency-input 11 of the PLL 5 and in the second switching state there is inputted the synchronisation voltage to such reference frequency-input 11 of the PLL 5.

Reference character 36 designates a NOR-gate or circuit, whose one logic input 37 is connected with the output 26 of the window comparator 24 and whose other logic input 38 is connected with the output 48 of the inverter or NOT-gate 47. At the output 39 of the NOR-gate 36 there therefore appears a logic signal "1" only then when the first control signal is missing and there is simultaneously present the second control signal. The output 39 is connected with the input 40 of an inverter or NOT-gate 41, so that at the output 42 of the inverter 41 there appears the logical complement of the signal appearing at the output 39 of the NOR-gate or circuit 36. Additionally, the output 39 is connected with a control input 43 of the switch 30 and the output 42 is connected with a control input 44 of the switch 31. If there is thus missing the first control signal during such time as there is present the second control signal, then the switch 30 becomes conductive, corresponding to the second switching state or condition. With all other combinations of control signals the switch 31 becomes conductive, corresponding to the first switching state or condition.

Figure 2:
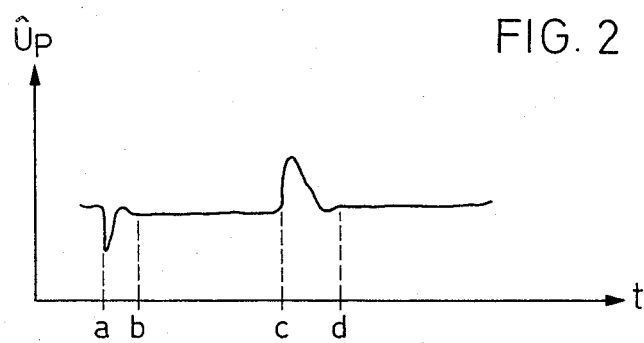
FIG. 2 illustrates an oscillograph for portraying the time course of a network voltage during load change.

The purpose of the circuit will be recognised upon explaining the appreciable disturbances of the network voltage. In FIG. 2 there has been illustrated the time course of a network voltage during the occurrence of fluctuations of the network voltage caused by load changes. Along the abscissa there has been plotted the time t. Along the ordinate there has been plotted the momentary or instantaneous upper or peak value $\hat{U}_P$ of the network voltage $U_P$. Thus, in FIG. 2 there appears the upper envelope of the network voltage. It has been plotted by the screen of an oscillograph. Prior to the time a the peak value $\hat{U}_P$ amounts to its reference value of 170 volts, the frequency amounts to 400 Hz. At the time a there is cut-on a load of 120 KVA. From the time a to the time b there is apparent a transient disturbance of the amplitude, which lasts for about 30 milliseconds and allows $\hat{U}_P$ to briefly drop by about 40 volts. From the time b to the time c the load is turned-on, and $\hat{U}_P$ remains approximately constant, but however about 7 volts lower than prior to the time a. At the time c there is cut-off the load. From the time c to the time d there is apparent a transient disturbance of the amplitude, which lasts for about 80 milliseconds and allows $\hat{U}_P$ to rise for a certain time by about 50 volts. The course following the time d is equivalent to the course prior to the time a. Such disturbances of the amplitude of the network voltage must follow the amplitude of the synchronisation voltage, because otherwise the time at which the thyristors fire will be shifted. The desired correction of the synchronisation voltage is accomplished by the formation of the product in the multiplier 12.

Figure 3:
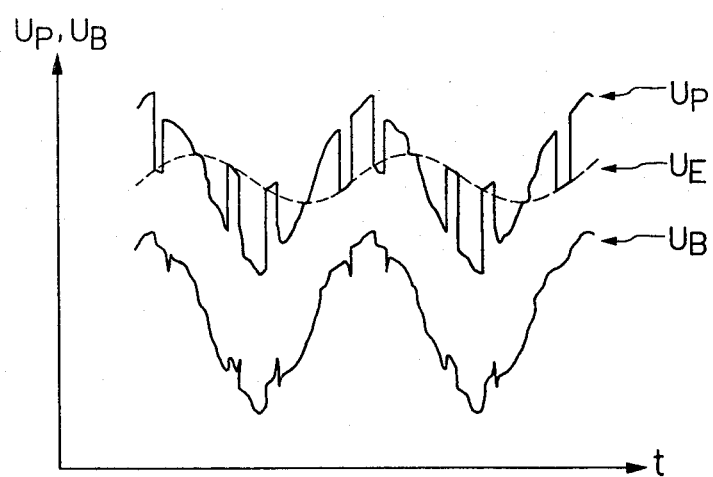
FIG. 3 illustrates an oscillograph for portraying the time course of a network voltage during commutation breakdowns as well as a voltage which correspondingly appears at the reference frequency-input of the PLL.

In FIG. 3 there has been illustrated the time course of a network voltage, during which there occur distortions caused by commutation breakdown. Again there is plotted along the abscissa the time t. Along the ordinate there is plotted the momentary or instantaneous value $U_P$ of the network voltage. It will be apparent that the time course of $U_P$ is a sinusoidal fundamental wave which is interrupted by the commutation breakdown. What is worthy of mention is, however, that the value of $U_P$ during the commutation breakdown corresponds to a broken line illustrated envelope $U_E$, which also is a sinusoidal fundamental wave or waveform. The fundamental waves of $U_P$ and $U_E$ are, however, as apparent from the illustration of FIG. 3, clearly phase shifted, so that the resultant, that is to say the sum of both fundamental waves acting as the effective network voltage likewise is phase shifted in relation to the fundamental wave of $U_P$. Measurements have shown that the effective network voltage can be phase shifted by $\pm 20°$ in relation to the fundamental wave of $U_P$. The course of $U_P$ is plotted by the screen of an oscillograph. The commutation breakdowns correspond to the powering of a stationary motor at a current of 300 amperes at a voltage of 120 volts and a frequency of 400 Hz (reference values). Simultaneously portrayed at the same screen and likewise plotted in FIG. 3 is the time course of the voltage $U_B$ which is applied to the reference frequency-input 11 of the PLL 5. It will be apparent that the fundamental wave of $U_B$ is equal in phase to the fundamental wave of $U_P$, i.e. the phase shift caused by the commutation breakdowns does not have any effect upon the phase of $U_B$. This is obtained in the following manner:

During a commutation breakdown the difference of the instantaneous value of the network voltage at the line or conductor 1 and the synchronisation voltage at the output 13 of the multiplier 12 is no longer very small. This is detected in the subtractor or subtracting unit 17, 18, and the first control signal no longer is present during the time duration of the commutation breakdown. This results in the feedback coupled PLL 5 now acting as a storage or memory for the phase of the network voltage until the synchronisation of the PLL 5 with the network voltage can be again accomplished, namely as soon as there has terminated the commutation breakdown. The effect of the reversing switch means or reversing switch 30, 31 will be recognised breakdowns are so to speak "cut-out" of the curve $U_P$ by the curved portions which have been "removed" from the synchronisation voltage, and in this manner the curve $U_B$ is "pieced together". In this way there is achieved the result that the PLL 5 is synchronised with an undistorted network voltage, which in reality is not present at all at the phase line or conductor 1, rather first must be derived in the form of $U_B$.

Immediately after the cutting-on or switching-in of the supply network the VCO 6 of the PLL 5 delivers a sinusoidal voltage having the desired amplitude. However, the frequency of this PLL-voltage generally appreciably deviates from the network frequency. As long as the PLL 5 is not locked to the network frequency there is absent the second control signal, which causes inputting of the network voltage to the reference frequency-input 11 of the PLL 5. The PLL 5 therefore can lock to the network frequency, whereupon there appears the second control signal and there is released the described switch-over or switching operation during commutation breakdowns.

While there are shown and described present preferred embodiments of the invention, it is to be distinctly understood that the invention is not limited thereto, but may be otherwise variously embodied and practiced within the scope of the following claims. Accordingly

What we claim is:

1. A circuit for generating a sinusoidal synchronisation voltage for the firing of thyristors in a current regulation circuit of a drive for an electric motor powered by a power supply network, comprising, in combination:

a phase-locked loop delivering an output voltage;
    means for forming the synchronisation voltage as the product of the output voltage of the phase-locked loop and the mean value of the magnitude of the network voltage of the power supply network such that the output voltage of the phase-locked loop essentially equals the synchronisation voltage when the network voltage is sinusoidal and its peak value possesses a predetermined reference value;
    means for comparing the synchronisation voltage with the network voltage and generating a first control signal when the network voltage essentially is equal to the synchronisation voltage;

said phase-locked loop having a reference frequency-input;

reversing switch means for conducting, during a first switching state thereof, the network voltage to the reference frequency-input of the phase-locked loop and, during a second switching state thereof, the synchronisation voltage to the reference frequency-input of the phase-locked loop;

means for comparing the phase of the voltage applied to the reference frequency-input of the phase-locked loop with the phase of the output voltage of the phase-locked loop and for generating a second control signal when the corresponding phase difference essentially equals null; and said reversing switch means being controlled by both control signals such that said reversing switch means, upon absence of the first control signal and simultaneous presence of the second control signal, assumes its second switching state, otherwise assumes its first switching state.

* * * * *